United States Patent
Vahid Far et al.

(10) Patent No.: US 9,716,188 B2
(45) Date of Patent: Jul. 25, 2017

(54) METAL OXIDE SEMICONDUCTOR (MOS) CAPACITOR WITH IMPROVED LINEARITY

(71) Applicant: QUALCOMM Incorporated, San Diego, CA (US)

(72) Inventors: Mohammad B. Vahid Far, San Jose, CA (US); Alireza Khalili, Sunnyvale, CA (US); Cheng-Han Wang, San Jose, CA (US); Phoebe Peihong Chen, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 675 days.

(21) Appl. No.: 14/014,827

(22) Filed: Aug. 30, 2013

(65) Prior Publication Data
US 2015/0061071 A1    Mar. 5, 2015

(51) Int. Cl.
*H02M 3/06*  (2006.01)
*H01L 29/94*  (2006.01)
(Continued)

(52) U.S. Cl.
CPC .......... *H01L 29/94* (2013.01); *H01L 27/0805* (2013.01); *H01L 27/0811* (2013.01); *H02M 3/18* (2013.01); *H02M 3/00* (2013.01)

(58) Field of Classification Search
CPC ..... H01L 29/94; H01L 28/40; H01L 27/0808; H01L 27/08; H01L 27/00; H01L 29/00; H02M 3/07; H02M 3/18
(Continued)

(56) References Cited

U.S. PATENT DOCUMENTS 4,508,982 A * 4/1985 Kapral ................. H03H 19/004
                                                              327/384
4,878,151 A * 10/1989 Gallichio .............. H01L 27/016
                                                              257/E27.116
(Continued)

FOREIGN PATENT DOCUMENTS

EP          2383781 A1    11/2011
GB          2223879 A      4/1990

OTHER PUBLICATIONS

International Search Report and Written Opinion of the International Searching Authority for International Application No. PCT/US2014/052354, mailed Dec. 23, 2014, 12 pages.
(Continued)

*Primary Examiner* — Rexford Barnie
*Assistant Examiner* — Jagdeep Dhillon
(74) *Attorney, Agent, or Firm* — Qualcomm Incorporated-Toler

(57) ABSTRACT

A MOS capacitor with improved linearity is disclosed. In an exemplary embodiment, an apparatus includes a main branch comprising a first signal path having a first capacitor pair connected in series with reversed polarities and a second signal path having a second capacitor pair connected in series with reversed polarities, the first and second signal paths connected in parallel. The apparatus also includes an auxiliary branch comprising at least one signal path having at least one capacitor pair connected in series with reversed polarities and connected in parallel with the main branch. In an exemplary embodiment, the capacitors are MOS capacitors.

15 Claims, 3 Drawing Sheets

(51) Int. Cl.
  *H02M 3/18* (2006.01)
  *H01L 27/08* (2006.01)
  *H02M 3/00* (2006.01)

(58) Field of Classification Search
  USPC ....... 307/109, 116, 9.1, 66, 82, 86; 327/552, 327/553, 554, 551; 455/307; 333/185
  See application file for complete search history.

(56) References Cited

U.S. PATENT DOCUMENTS

| | | | | |
|---|---|---|---|---|
| 5,028,876 | A * | 7/1991 | Cadwell | G01D 5/2417 324/660 |
| 6,657,509 | B1 * | 12/2003 | Ohannes | H03B 5/1253 331/117 FE |
| 6,873,359 | B1 * | 3/2005 | Kozlowski | H04N 5/3745 250/208.1 |
| 8,143,941 | B2 | 3/2012 | Park et al. | |
| 8,817,501 | B1 * | 8/2014 | Low | H02M 3/07 363/59 |
| 8,947,157 | B2 | 2/2015 | Levesque | G05F 1/595 327/536 |
| 8,952,748 | B2 * | 2/2015 | Guimaraes | H01L 28/40 327/554 |
| 2002/0089366 | A1 | 7/2002 | Gupta | |
| 2005/0099188 | A1 * | 5/2005 | Baxter | G01D 5/24 324/678 |
| 2005/0185426 | A1 | 8/2005 | Brauchler | |
| 2006/0017513 | A1 * | 1/2006 | Geynet | H03B 5/1296 331/36 C |
| 2008/0284495 | A1 | 11/2008 | Chan et al. | |
| 2009/0128992 | A1 | 5/2009 | Haralabidis et al. | |
| 2011/0109380 | A1 * | 5/2011 | Park | H03H 11/126 327/553 |
| 2015/0236014 | A1 * | 8/2015 | Gathman | H01L 27/0808 327/537 |
| 2015/0381171 | A1 * | 12/2015 | Cebi | H03K 17/687 327/427 |

OTHER PUBLICATIONS

Tille, T. et al., "A Low-Voltage MOSFET-Only [Sigma][Delta] Modulator for Speech Band Applications Using Depletion-Mode MOS-Capacitors in Combined Series and Parallel Compensation," The 2001 IEEE International Symposium on Circuits and Systems, vol. 1, May 6-9, 2001, pp. 376-379.

Tille, T. et al., "Design of Low-Voltage MOSFET-Only [Sigma][Delta] Modulators in Standard Digital CMOS Technology," IEEE Transactions on Circuits and Systems I: Regular Papers, vol. 51, Issue 1, Jan. 2004, pp. 96-109.

* cited by examiner

METAL OXIDE SEMICONDUCTOR (MOS) CAPACITOR WITH IMPROVED LINEARITY

BACKGROUND

Field

The present application relates generally to the operation and design of capacitors, and more particularly, to the operation and design of MOS capacitors with improved linearity.

Background

Metal oxide semiconductor (MOS) capacitors are used in many applications, such as in analog filters. MOS capacitors are much denser than metal-on-metal (MOM) capacitors and therefore can be used in place of MOM capacitors to save circuit area. For example, the ratio of capacitance to area is almost five times greater for a MOS capacitor than for a MOM capacitor.

Unfortunately, MOS capacitors may exhibit non-linearity caused by capacitance variation with respect to voltage. For example, the capacitance provided by a MOS capacitor changes as the voltage across the capacitor changes. This nonlinearity mainly happens during MOS capacitor transition from depletion to oxide region and vice versa when capacitor voltage varies. One technique to improve linearity is similar to a multi-tan technique in which multiple stages are added together while some of the MOS capacitors are moving from oxide to depletion region and the rest are moving from depletion to oxide region. This results in reduced capacitor variation. Unfortunately, this technique provides only limited improvement. Thus, MOS capacitors may not be suitable for use in applications having large voltage swings across the capacitor where high linearity is necessary.

Therefore, it is desirable to have a MOS capacitor with improved linearity for use in applications where high linearity is necessary, thereby allowing circuit area savings to be realized.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
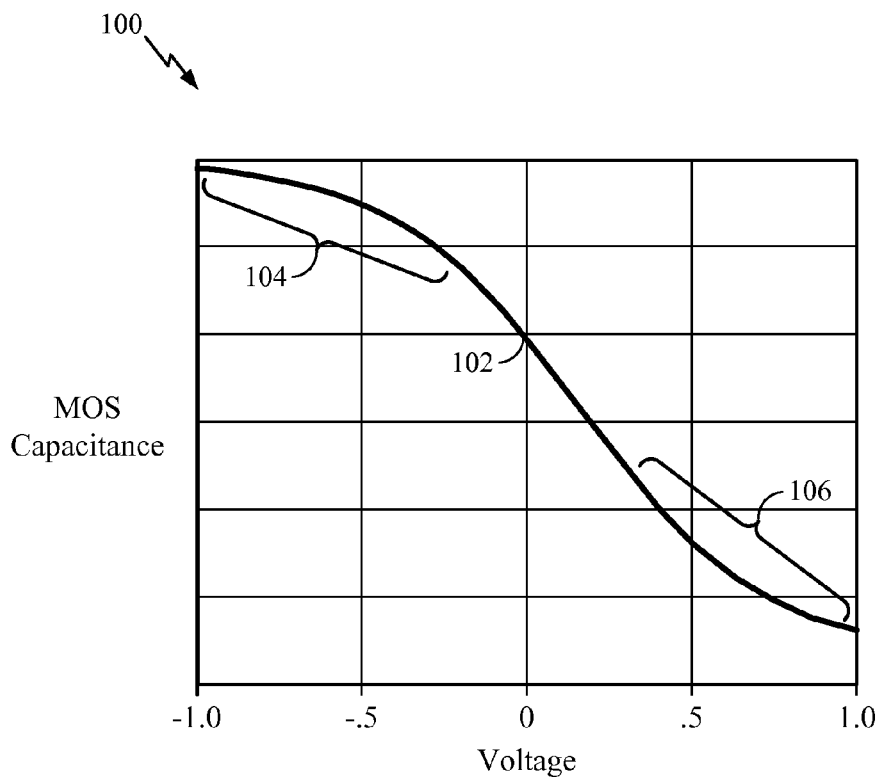
FIG. 1 shows a graph that illustrates the relationship between capacitance and voltage for a MOS capacitor.

FIG. 1 shows a graph 100 that illustrates the relationship between capacitance and voltage for a MOS capacitor. In the graph 100, capacitance is represented on the vertical axis and voltage is represented on the horizontal axis. As shown by the plot line 102, the MOS capacitor exhibits a capacitance change with a change in voltage. The plot line 102 comprises two portions that correspond to the operating regions of the MOS capacitor. A first portion 104 of the plot line 102 illustrates the capacitance variation with voltage when the MOS capacitor is operating in an oxide region. A second portion 106 of the plot line 102 illustrates the capacitance variation with voltage when the MOS capacitor is operating in a depletion region. As described in greater detail below, improved linearity can be achieved by biasing the MOS capacitor to operate in either the oxide region or the depletion region.

Figure 2:
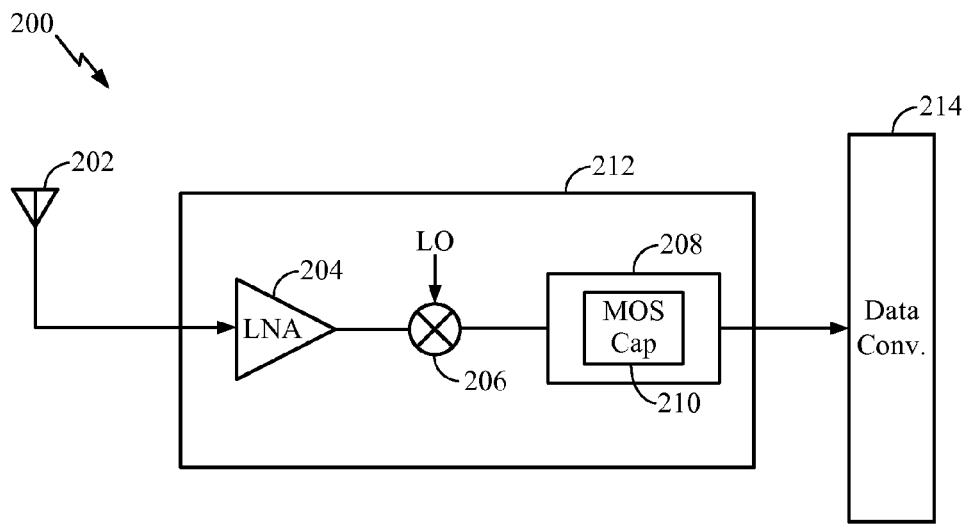
FIG. 2 shows a receiver front end that comprises an exemplary embodiment of a MOS capacitor with improved linearity.

FIG. 2 shows a receiver 200 that comprises an exemplary embodiment of a MOS capacitor apparatus 210 with improved linearity. For example, the receiver 200 comprises an antenna 202 that receives RF signals and inputs these signals to a low noise amplifier (LNA) 204. The output of the LNA 204 is input to a downconverter 206 that downconverts the RF signal to baseband based on a local oscillator (LO) signal. The baseband signals are input to a baseband filter (BBF) 208, which filters the signals before input to a data converter 214.

The baseband filter 208 comprises a MOS capacitor apparatus 210. As disclosed in greater detail below, the MOS capacitor apparatus 210 is configured to provide improved linearity over conventional MOS capacitors. The MOS capacitor apparatus 210 also has a greater density than MOM capacitors, so that the BBF 208 can be implemented in a circuit that uses less circuit area by using the MOS capacitor apparatus 210 instead of a MOM capacitor.

Figure 3:
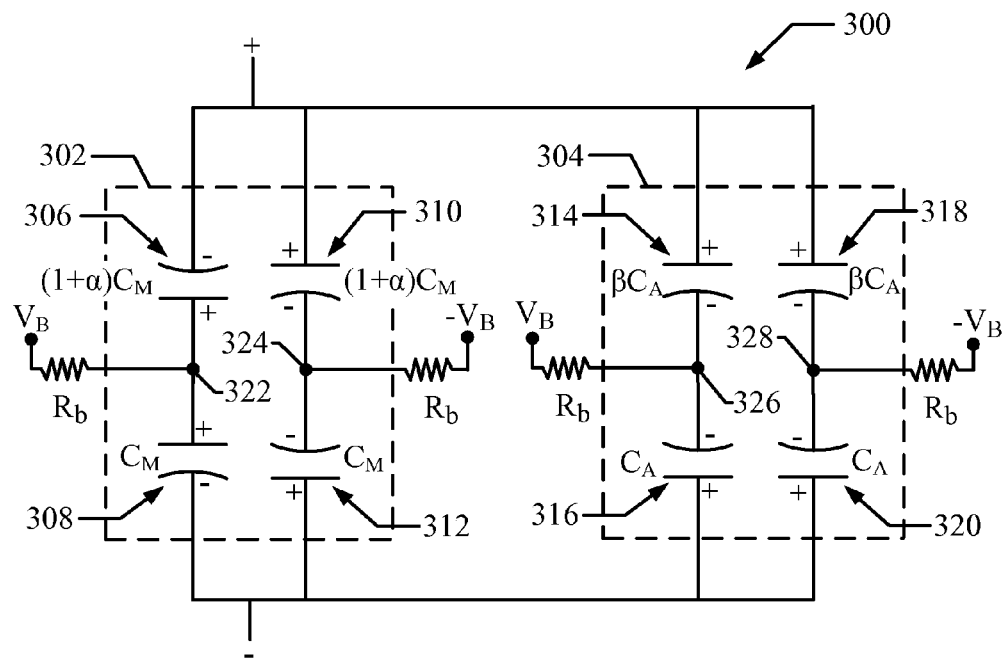
FIG. 3 shows a detailed exemplary embodiment of a MOS capacitor apparatus that is configured for improved linearity.

FIG. 3 shows a detailed exemplary embodiment of a MOS capacitor apparatus 300 that is configured for improved linearity. For example, the MOS capacitor apparatus 300 is suitable for use as the MOS capacitor apparatus 210 shown in FIG. 2.

The MOS capacitor apparatus 300 comprises a main branch 302 connected in parallel to an auxiliary branch 304. The main branch 302 comprises a first MOS capacitor pair 306, 308 connected in series between a positive signal terminal (+) and a negative signal terminal (−). The first MOS capacitor pair 306, 308 is connected to receive a bias voltage ($V_B$) at node 322. In an exemplary embodiment, the bias voltage ($V_B$) is coupled to the node 322 through bias resistor ($R_b$). The positive terminals of the capacitors 306 and 308 are connected to the node 322, and the negative terminals of the capacitors 306 and 308 are connected to the positive signal terminal (+) and the negative signal terminal (−), respectively.

The main branch 302 also comprises a second MOS capacitor pair 310, 312 that is connected in series between the positive signal terminal (+) and the negative signal terminal (−). Thus, the second MOS capacitor pair 310, 312 is connected in parallel with the first MOS capacitor pair 306, 308. The second MOS capacitor pair 310, 312 is connected to receive a negative bias voltage (-$V_B$) at node 324. In an exemplary embodiment, the negative bias voltage (-$V_B$) is coupled to the node 324 through bias resistor ($R_b$). The negative terminals of the capacitors 310 and 312 are connected to the node 324, and the positive terminals of the capacitors 310 and 312 are connected to the positive signal terminal (+) and the negative signal terminal (-), respectively.

The auxiliary branch 304 comprises a third MOS capacitor pair 314, 316 connected in series between the positive signal terminal (+) and the negative signal terminal (-). Thus, the third MOS capacitor pair 314, 316 is connected in parallel with the main branch 302. The third MOS capacitor pair 314, 316 is connected to receive a bias voltage ($V_B$) at node 326. In an exemplary embodiment, the bias voltage ($V_B$) is coupled to the node 326 through bias resistor ($R_b$). The negative terminals of the capacitors 314 and 316 are connected to the node 326, and the positive terminals of the capacitors 314 and 316 are connected to the positive signal terminal (+) and the negative signal terminal (-), respectively.

The auxiliary branch 304 also comprises a fourth MOS capacitor pair 318, 320 connected in series between the positive signal terminal (+) and the negative signal terminal (-). Thus, the fourth MOS capacitor pair 318, 330 is connected in parallel with the main branch 302. The fourth MOS capacitor pair 318, 320 is connected to receive a negative bias voltage (-$V_B$) at node 328. In an exemplary embodiment, the negative bias voltage (-$V_B$) is coupled to the node 328 through bias resistor ($R_b$). The negative terminals of the capacitors 318 and 320 are connected to the node 328, and the positive terminals of the capacitors 318 and 320 are connected to the positive signal terminal (+) and the negative signal terminal (-), respectively.

In various exemplary embodiments, the MOS capacitor apparatus 300 utilizes one or more novel features to achieve highly linear capacitance with small circuit size. For example, the MOS capacitor apparatus 300 utilizes one or more of the following features.

Back-to-Back Capacitor Configuration

As illustrated in FIG. 3, the main capacitor branch 302 comprises two signal paths that utilize four MOS capacitors in a back-to-back configuration. For example, a first signal path comprises the capacitors 306, 308 that are connected back-to-back so that along their signal path their polarities are reversed. A positive bias voltage is provided at node 322, which causes the capacitors 306 and 308 to operate in the oxide region (i.e., region 104 shown in FIG. 1). By reversing the polarities of the two capacitors, the combined capacitance will have less variation with voltage.

A second signal path in the main branch 302 comprises capacitors 310 and 312. The polarities of the capacitors 310 and 312 in the second signal path are also reversed along the second signal path. A negative bias voltage is provided at node 324, which causes the capacitors 310 and 312 to operate in the oxide region (i.e., region 104 shown in FIG. 1). As a result, the capacitors 306, 308, 310, and 312 of the main branch 302 are configured to operate in the oxide region and will combine to have reduced variation at the corners of a capacitance-voltage (CV) curve in addition to linear operation around V=0.

Thus, each signal path of the main branch 302 has less capacitance variation with voltage due to the reversed capacitor polarities and the total capacitance variation is further reduced by combining the two signal paths to determine the total capacitance of the main branch 302.

Auxiliary Capacitor Branches

Another feature included in the MOS capacitor apparatus 300 is the use of auxiliary branches. For example, the apparatus 300 comprises one auxiliary branch 304; however multiple auxiliary branches can be used.

The capacitors of the auxiliary branch 304 are connected in series with their polarities reversed and are biased to operate in either depletion mode or oxide mode. For example, the capacitors 314 and 316 have their negative terminals connected to the node 326, which is biased with a positive voltage ($V_B$). The capacitors 318 and 320 have their negative terminals connected to the node 328, which is biased with a negative voltage (-$V_B$).

The back-to-back configuration and biasing of the auxiliary branch 304 operates to improve the linearity of the overall capacitance provided by the MOS capacitor apparatus 300. The capacitors of the auxiliary branch 304 are also sized to achieve improved linearity.

Capacitor Biasing

Another feature included in the MOS capacitor apparatus 300 is capacitor biasing. For example, the signal paths of the main branch 302 are biased with bias voltages -$V_B$ and +$V_B$. In an exemplary embodiment, the voltage $V_B$ is equal to a supply voltage, but may be configured for other values in other embodiments. By biasing the signal paths of the main branch 302, the capacitors are forced to operate in either the oxide region or the depletion region. Using a large bias voltage to force operation in one of the two regions of the MOS capacitor avoids the possibility of crossing over between regions due to small signal variations. As a result, less capacitance variation and greater linearity can be obtained. Biasing is provided for all of the signal paths of the main 302 and auxiliary 304 branches as illustrated in FIG. 3.

Capacitor Sizing Ratios

Another feature included in the MOS capacitor apparatus 300 is sizing of the MOS capacitors to achieve selected sizing ratios thereby improving linearity. For example, the ratio of the capacitors in the main branch 302 is adjusted to get the desired capacitance from the main branch 302 while reducing the capacitance variation with voltage at the ends of the CV curve where voltage is a maximum. In an exemplary embodiment, the capacitance values of the capacitors 308 and 312 are designated as $C_M$. The capacitance values for the capacitors 306 and 310 are designated as $(1+\alpha)*C_M$.

The ratio of the capacitors in the auxiliary branch 304 is adjusted to get the proper capacitance variation with voltage but in the opposite direction respect to the main branch 302 to cancel out the capacitance variation of the main branch 302 when the two branches are combined in parallel. In an exemplary embodiment, the capacitance values of the capacitors 316 and 320 are designated as $C_A$. The capacitance values for the capacitors 314 and 318 are designated as $\beta*C_A$. For example, in one implementation, the following capacitance relationships apply.

1. $C_M=6*C_A$
2. $\beta=3$
3. $\alpha=-\frac{1}{6}$

Thus, in various exemplary embodiments, the MOS capacitor apparatus 300 includes the following novel features.

1. A main branch comprising MOS capacitor pairs connected in series and in parallel with reverse polarity to improve linearity.

2. Large offset biasing to eliminate transitions between the oxide and depletion operating regions and force MOS capacitor operation in either the oxide or the depletion regions.
3. One or more auxiliary branches connected in parallel with the main branch. The auxiliary branches comprising MOS capacitor pairs connected in series and in parallel with reverse polarity to improve linearity.
4. Capacitance ratios selected within the main branch, within the auxiliary branch, and between the main and auxiliary branches to further improve linearity.

Figure 4:
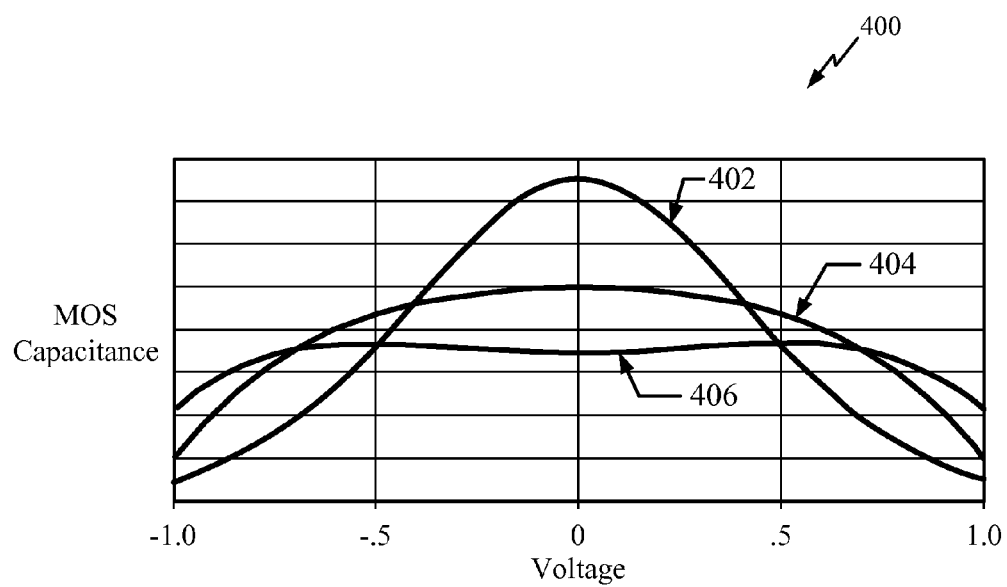
FIG. 4 shows a graph that illustrates the relationship between capacitance and voltage for an exemplary embodiment of the MOS capacitor apparatus shown in FIG. 3.

FIG. 4 shows a graph 400 that illustrates the relationship between capacitance and voltage for an exemplary embodiment of the MOS capacitor apparatus 300 shown in FIG. 3. In the graph 400, capacitance is represented on the vertical axis and voltage is represented on the horizontal axis.

The plot line 402 illustrates the improvement in capacitance variation with voltage by utilizing only the back-to-back configuration feature of the MOS capacitor apparatus 300. For example, utilizing only the main branch 302. The plot line 404 illustrates the additional improvements in capacitance variation with voltage by utilizing the capacitor biasing feature of the MOS capacitor apparatus 300. For example, utilizing large bias voltages forces capacitor operation in either the oxide or depletion regions. The plot line 406 illustrates the further improvements in capacitance variation with voltage by utilizing the auxiliary branch feature of the MOS capacitor apparatus 300. For example, the auxiliary branch 304 is configured with a back-to-back configuration, large bias voltages and connected in parallel with the main branch 302.

It should also be understood that the embodiments, techniques and implementations described herein can be applied to other capacitor technologies that exhibit similar non-linear characteristics. Thus, the various embodiments are not limited to implementations with only MOS capacitors, but may be implemented with other capacitor types or equivalents.

Figure 5:
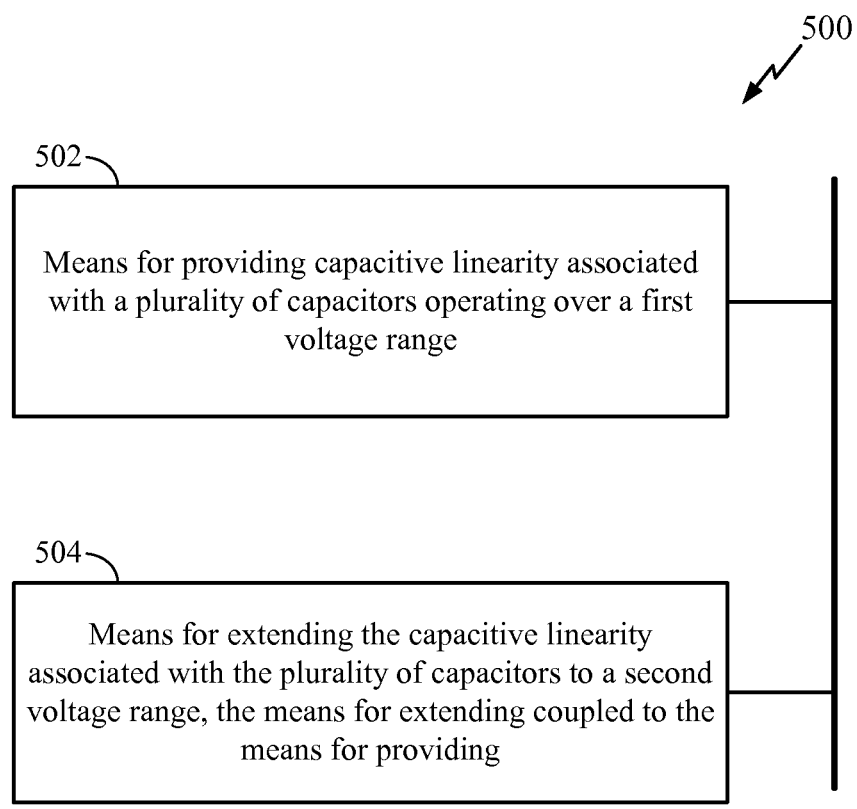
FIG. 5 shows an exemplary embodiment of a MOS capacitor apparatus configured for improved linearity.

FIG. 5 shows an exemplary embodiment of a MOS capacitor apparatus 500 configured for improved linearity. For example, the apparatus 500 is suitable for use as the MOS capacitor apparatus 300 shown in FIG. 3. In an aspect, the apparatus 500 is implemented by one or more modules configured to provide the functions as described herein. For example, in an aspect, each module comprises hardware and/or hardware executing software.

The apparatus 500 comprises a first module comprising means (502) for providing capacitive linearity associated with a plurality of capacitors operating over a first voltage range, which in an aspect comprises the main branch 302.

The apparatus 500 comprises a second module comprising means (504) for extending the capacitive linearity associated with the plurality of capacitors to a second voltage range, the means for extending coupled to the means for providing, which in an aspect comprises the auxiliary branch 304.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus comprising:
a main branch comprising a first signal path having a first capacitor pair connected in series with first reversed polarities and a second signal path having a second capacitor pair connected in series with second reversed polarities, the first and second signal paths connected in parallel, wherein the first capacitor pair is configured to receive a first bias voltage, and wherein the second capacitor pair is configured to receive a second bias voltage that is different than the first bias voltage; and
an auxiliary branch comprising at least one signal path having at least one capacitor pair connected in series with third reversed polarities and connected in parallel with the main branch, wherein the first capacitor pair, the second capacitor pair, and the at least one capacitor pair are configured to improve linearity of an analog filter.

2. The apparatus of claim 1, wherein the first and second capacitor pairs comprise first and second metal oxide semiconductor (MOS) capacitor pairs, respectively, and the at least one capacitor pair comprises at least one MOS capacitor pair.

3. The apparatus of claim 1, wherein the first capacitor pair comprises a first capacitor and a second capacitor, and wherein the first capacitor has a first positive terminal connected to a second positive terminal of the second capacitor.

4. The apparatus of claim 3, wherein the second capacitor pair comprises a third capacitor and a fourth capacitor, wherein the third capacitor has a first negative terminal connected to a second negative terminal of the fourth capacitor, and wherein a third positive terminal of the third capacitor is coupled to a third negative terminal of the first capacitor.

5. The apparatus of claim 2, wherein the at least one MOS capacitor pair has a capacitance ratio, and wherein each of the first and second MOS capacitor pairs has a capacitance ratio with respect to the at least one MOS capacitor pair.

6. The apparatus of claim 1, wherein positive terminals of the first capacitor pair are configured to receive the first bias voltage, and wherein negative terminals of the second capacitor pair are configured to receive the second bias voltage.

7. The apparatus of claim 1, wherein each of the first and second capacitor pairs has a capacitance ratio with respect to the at least one capacitor pair.

8. The apparatus of claim 2, wherein the at least one signal path comprises a third signal path having a third MOS capacitor pair connected in series with the third reversed polarities and a fourth signal path having a fourth MOS capacitor pair connected in series with fourth reversed polarities, the third and fourth signal paths connected in parallel with the main branch.

9. The apparatus of claim 4, wherein the at least one capacitor pair comprises a fifth capacitor and a sixth capacitor, wherein the fifth capacitor has a fourth negative terminal connected to a fifth negative terminal of the sixth capacitor.

10. The apparatus of claim 1, wherein the first capacitor pair comprises a first capacitor and a second capacitor, wherein the first capacitor has a first terminal coupled to a positive signal terminal and a second terminal coupled to a third terminal of the second capacitor, and wherein the second capacitor has a fourth terminal coupled to a negative signal terminal.

11. The apparatus of claim 10, wherein the second capacitor pair has a third capacitor and a fourth capacitor, wherein the third capacitor has a fifth terminal coupled to the positive signal terminal and a sixth terminal coupled to a seventh terminal of the fourth capacitor, and wherein the fourth capacitor has an eighth terminal coupled to the negative signal terminal, wherein the second terminal of the first capacitor and the third terminal of the second capacitor are connected to a first bias resistor.

12. The apparatus of claim 11, wherein the second terminal of the third capacitor and the third terminal of the fourth capacitor are connected to a second bias resistor.

13. The apparatus of claim 1, wherein the first capacitor pair is coupled to a first bias resistor, and wherein the second capacitor pair is coupled to a second bias resistor.

14. The apparatus of claim 1, wherein the second bias voltage is a negative voltage, and wherein the second bias voltage has a magnitude that is the same as a magnitude of the first bias voltage.

15. The apparatus of claim 1, wherein a first orientation of terminals of the first capacitor pair is different than a second orientation of terminals of the second capacitor pair.

* * * * *